(12) United States Patent
Chou

(10) Patent No.: US 10,832,910 B2
(45) Date of Patent: *Nov. 10, 2020

(54) METHODS OF FABRICATING A DEVICE

(71) Applicant: Micron Technology, Inc., Boise, ID (US)

(72) Inventor: Kuo-Yao Chou, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/405,319

(22) Filed: May 7, 2019

(65) Prior Publication Data

US 2019/0259614 A1    Aug. 22, 2019

Related U.S. Application Data

(63) Continuation of application No. 15/729,370, filed on Oct. 10, 2017, now Pat. No. 10,312,086, which is a continuation of application No. 15/155,090, filed on May 16, 2016, now Pat. No. 9,786,504.

(51) Int. Cl.
*H01L 21/033* (2006.01)

(52) U.S. Cl.
CPC ...... *H01L 21/0338* (2013.01); *H01L 21/0332* (2013.01); *H01L 21/0335* (2013.01); *H01L 21/0337* (2013.01)

(58) Field of Classification Search
CPC ............. H01L 21/0338; H01L 21/0332; H01L 21/0335; H01L 21/0337
See application file for complete search history.

(56) References Cited

U.S. PATENT DOCUMENTS

| 7,799,512 | B2 | 9/2010 | Cho et al. |
| 8,309,463 | B2 | 11/2012 | Lee |
| 8,404,407 | B2 | 3/2013 | Hashimoto et al. |
| 9,786,504 | B1 * | 10/2017 | Chou .................. H01L 21/0332 |

(Continued)

FOREIGN PATENT DOCUMENTS

| CN | 101025569 A | 8/2007 |
| CN | 101299408 A | 11/2008 |

(Continued)

OTHER PUBLICATIONS

Taiwanese Office Action dated May 26, 2017 and Search Report dated Apr. 24, 2017 from Taiwanese Application No. 105130191, 6 pages with English translation.

*Primary Examiner* — Duy Vu N Deo
(74) *Attorney, Agent, or Firm* — TraskBritt

(57) ABSTRACT

A method for processing a substrate is provided. The method comprises forming a patterned photoresist over a first material, the patterned photoresist comprising island portions and shaped spaces surrounding the island portions. An area of each of the island portions is reduced to enlarge the shaped spaces, which are filled with a second material. The island portions are removed to form first openings in the second material. Portions of the first material exposed through the first openings are removed to form second openings in the first material. Portions of a substrate exposed through the second openings are removed to form holes in the substrate. Methods of patterning a substrate and methods of forming a hole pattern in a substrate are also disclosed.

20 Claims, 7 Drawing Sheets

(56) References Cited

U.S. PATENT DOCUMENTS

| | | | |
|---|---|---|---|
| 10,312,086 B2 * | 6/2019 | Chou | H01L 21/0332 |
| 2008/0076070 A1 | 3/2008 | Koh et al. | |
| 2015/0236159 A1 * | 8/2015 | He | H01L 29/66795 |
| | | | 257/401 |

FOREIGN PATENT DOCUMENTS

| | | |
|---|---|---|
| CN | 102142367 A | 8/2011 |
| TW | 200836242 A | 9/2008 |
| TW | 201007817 A | 2/2010 |

* cited by examiner

METHODS OF FABRICATING A DEVICE

CROSS-REFERENCE TO RELATED APPLICATION

This application is a continuation of U.S. patent application Ser. No. 15/729,370, filed Oct. 10, 2017, now U.S. Pat. No. 10,312,086, issued Jun. 4, 2019, which is a continuation of U.S. patent application Ser. No. 15/155,090, filed May 16, 2016, now U.S. Pat. No. 9,786,504, issued Oct. 10, 2017, the disclosure of each of which is hereby incorporated herein in its entirety by this reference.

TECHNICAL FIELD

Embodiments disclosed herein relate to fabrication of semiconductor devices, such as to methods of processing a substrate. More particularly, embodiments of the disclosure relate to methods of patterning the substrate of the semiconductor device and to methods of forming a hole pattern in the substrate of the semiconductor device.

BACKGROUND

As semiconductor devices become smaller and highly integrated, an area of a cell region in the semiconductor device, which contains patterns, is practically decreased. However, difficulties may occur in attempting to create uniform and dense patterns with fine features due to limitations of the exposure apparatus.

Thus, the recent tendency in fabricating highly integrated semiconductor devices is greatly affected by the development of the photolithographic techniques. An LELE (Litho/Etch/Litho/Etch) double masking technique has been used to form dense patterns with fine features in a limited cell region. However, misalignment and printing defects may occur during the double or repeated masking process. In addition, this conventional technique has difficulty in forming a fine pattern having a critical dimension.

Furthermore, in order to obtain fine patterns, multiple-stacked layers especially mask layers have been recently used, thereby increasing the heights of the whole structure and leading to a high aspect ratio. The high aspect ratio is one of the crucial issues to be avoided in order to form precise structures.

Accordingly, an improved method for forming a fine and precise pattern such as contact holes is required.

BRIEF SUMMARY

The present disclosure relates to a method for forming a patterned layer. This disclosure further relates to a method for forming a patterned layer with fine and dense features using a single masking process.

In various embodiments of the present disclosure, the method comprises forming a first material layer over a first substrate; forming a photoresist layer on the first material layer, wherein the photoresist layer includes at least one island portion and a spacing surrounding a lateral portion of the island portion; trimming the island portion to enlarge the spacing; forming a second material layer filled in the enlarged spacing and surrounding the trimmed island portion; removing the trimmed island portion to form a first opening passing through the second material layer and exposing a portion of the first material layer; and removing the exposed portion of the first material layer through the first opening to form a second opening in the first material layer.

In various embodiments of the present disclosure, the method for forming the patterned layer comprises forming a target layer over a substrate; forming a first material layer over the target layer, the first material layer being different from the target layer; forming a photoresist layer on the first material layer, wherein the photoresist layer includes a plurality of island portions and a spacing between the island portions; shrinking each of the island portions to enlarge the spacing; forming a second material layer filled in the enlarged spacing and surrounding the shrunk island portions; removing the shrunk island portions to form a plurality of the first openings in the second material layer and exposing portions of the first material layer; removing the exposed portions of the first material layer through the first openings of the second material layer to form a plurality of second openings in the first material layer, the second openings exposing portions of the target layer; and removing the exposed portions of the target layer through the second openings of the first material layer to form a plurality of holes passing through the target layer.

BRIEF DESCRIPTION OF THE DRAWINGS

The disclosure may be more fully understood by reading the following detailed description of the embodiment, with reference made to the accompanying drawings as follows:

FIGS. 2A through 7A are top views of the semiconductor device illustrating a method for forming a patterned layer in accordance with the present invention.

FIGS. 2B through 7B are cross-sectional views of respective FIGS. 2A through 7A, taken along the A-A' line of FIGS. 2A through 7A.

DETAILED DESCRIPTION

Figure 1:
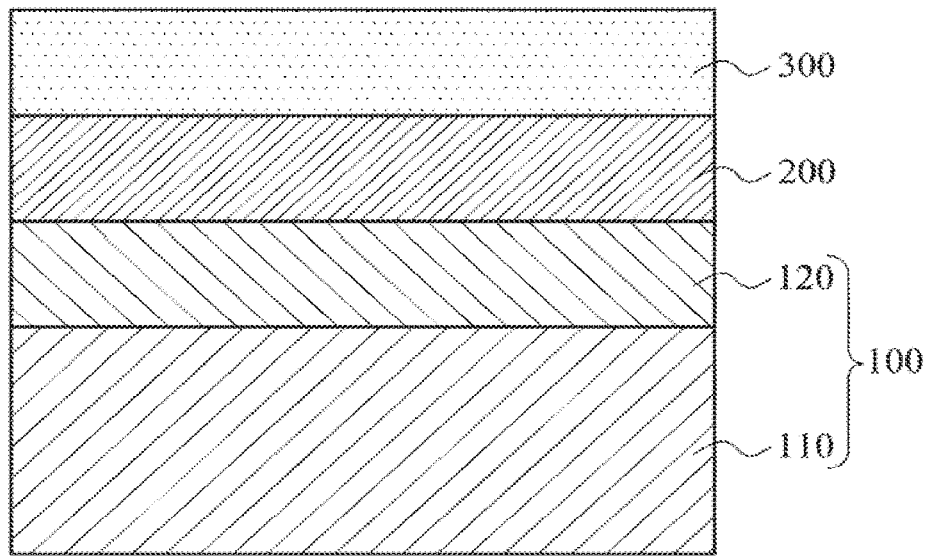
FIG. 1 illustrates a cross-sectional view of a semiconductor device.

Reference will now be made in detail to the present embodiments of the invention, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

According to various embodiments, the misalignment and printing defect problem in the double or repeated masking process can be avoided. In addition, only one single photolithographic process is required for forming the patterned layer, not only to reduce the cost but also to increase the precision of the patterned layer. In some embodiments of the present disclosure, features such as contact holes can be formed precisely and uniformly and the half pitch of the features can be even down to about less than 20 nm.

FIGS. 1 through 7B diagrams collectively illustrating a method for forming a patterned layer according to various embodiments of the present disclosure. FIG. 1 is a cross-sectional view at a process stage of the method. FIGS. 2A through 7A are top views at various stages of the method, and FIGS. 2B through 7B are cross-sectional views taken along line A-A' of FIGS. 2A through 7A, respectively.

Referring to FIG. 1, a first material layer 200 is formed over a first substrate 100 of semiconductor device 10. Thereafter, a photoresist layer 300 is formed over the first material layer 200. According to some embodiments of the present disclosure, the first substrate 100 includes a second substrate 110 and at least a target layer 120 formed there over.

In some embodiments, the second substrate 110 may comprise an elementary semiconductor material, such as silicon (Si) or germanium (Ge) in a crystalline structure; a compound semiconductor material, such as silicon germanium (SiGe), silicon carbide (SiC), gallium arsenic (GaAs), gallium phosphide (GaP), indium phosphide (InP), indium arsenide (InAs), and/or indium antimonide (InSb); or a combination thereof. Further, the second substrate 110 may also be a bulk silicon substrate or a Silicon-On-Insulator (SOI) substrate. The target layer 120 may be made of the same or different materials from the second substrate 110.

In some embodiments, the first material layer 200 may be used as a mask layer in subsequent processes, which is described in detail hereinafter. In some examples, the first material layer 200 may be formed of non-metal such as silicon dioxide, silicon nitride, nitride, oxynitride, silicon oxynitride, carbide, silicon carbide, or the like. The first material layer 200 may also be formed of material such as metal nitride, metal oxide, or the like. Furthermore, the first material layer 200 may be formed by thermal oxidation, chemical vapor deposition (CVD), plasma-enhanced chemical vapor deposition (PECVD), low-pressure chemical vapor deposition (LPCVD), or the like.

Figure 2A:
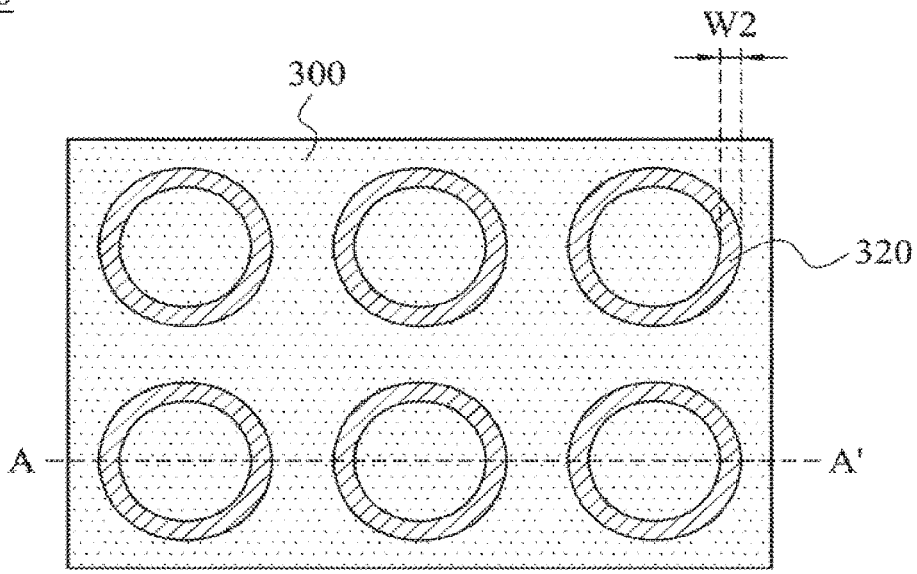
Figure 2B:
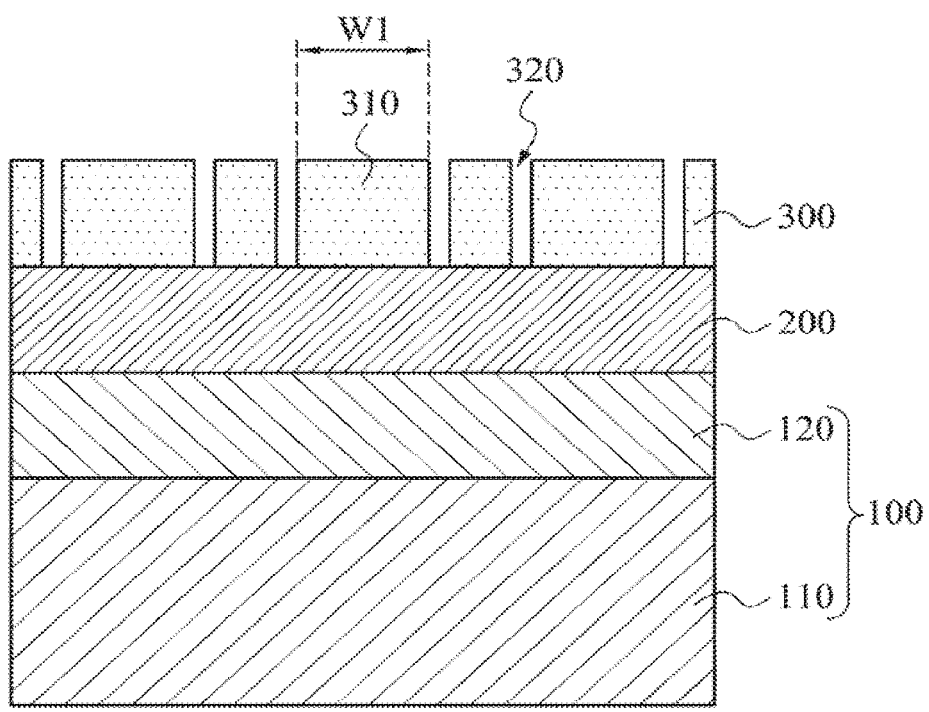

Referring to FIGS. 2A and 2B, a photolithographic process is performed to transfer a first pattern into the photoresist layer 300. The first pattern of the photoresist layer 300 includes a plurality of island portions 310 and a spacing 320 laterally surrounding the island portions 310. A portion of the first material layer 200 is exposed through the spacing 320. The island portions 310 have a first width W1 and the spacing 320 has a second width W2.

Examples of the lithography process include, but are not limited to, photoresist coating (e.g., spin-on coating), soft baking, mask aligning, exposure, post-exposure baking, developing, rinsing, drying (e.g., hard baking), and a combination thereof. In some embodiments, the exposure may be a single exposure, a double exposure or a multiple exposure, but, preferably, a single exposure in order to avoid misalignment.

In some embodiments, the material of the photoresist layer 300 may be a positive photoresist or a negative photoresist.

In some embodiments, the spacing 320 forms ring-shaped patterns in the photoresist layer 300. The ring-shaped patterns may be circular rings, irregular rings, polygonal rings such as triangle rings, rectangle rings, hexagonal rings, or other types of rings.

Figure 3A:
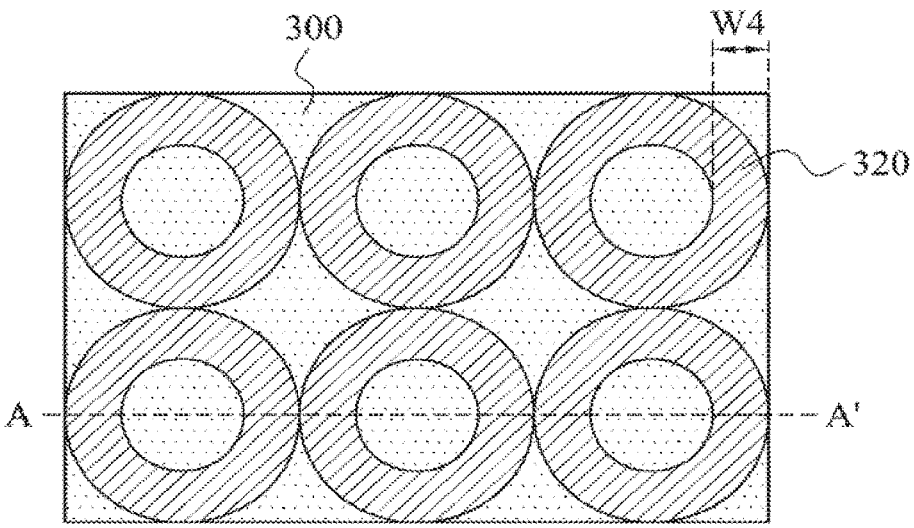
Figure 3B:
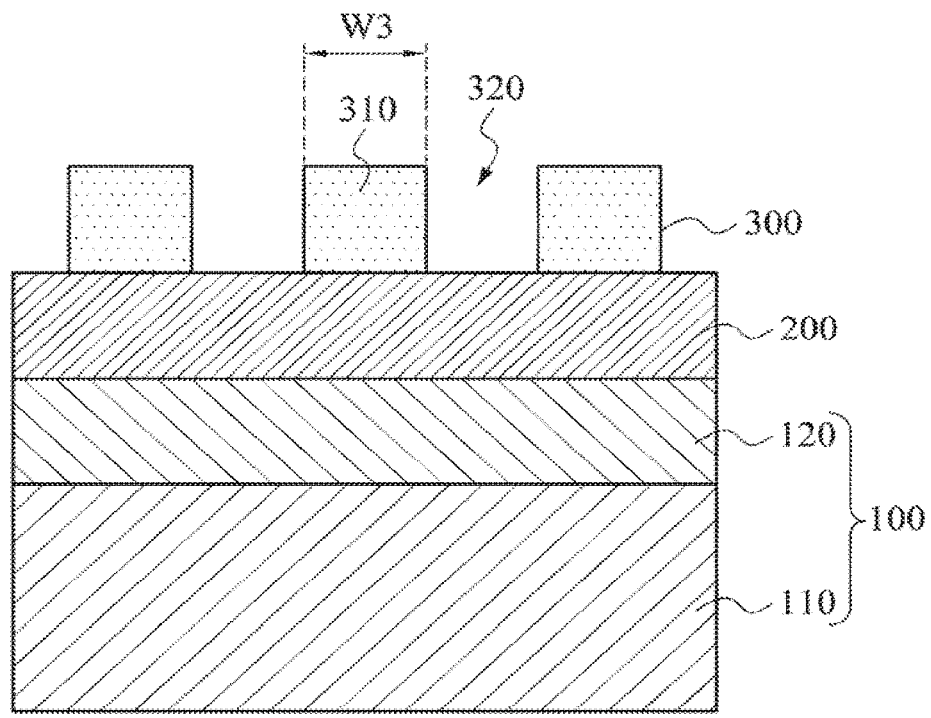

Referring to FIGS. 3A and 3B, a trimming process is performed to remove a portion of each island portion 310 to reduce the size of each island portion 310 and enlarge the spacing 320 within the photoresist layer 300, thereby forming a second pattern in the photoresist layer 300. After the trimming process is performed, more portions of the first material layer 200 are exposed through the enlarged spacing 320.

The trimming process shrinks each of the island portions 310 and reduces the dimensions thereof, and therefore a feature with a relative smaller dimension may be obtained in the subsequent processes. Each of the shrunk island portions 310 has a third width W3 and the enlarged spacing 320 has a fourth width W4. The third width W3 of the shrunk island portions 310 after the trimming process is less than the first width W1 (shown in FIG. 2B) of the island portions 310 before the trimming process. The fourth width W4 of the enlarged spacing 320 after the trimming process is larger than the second width W2 (shown in FIG. 2A) of the spacing 320 before the trimming process.

In some embodiments, the shrunk island portions 310 substantially define the patterns of certain features such as contact holes to be fabricated in subsequent processes. The half pitch of the shrunk island portions 310 may be more than 20 nm or even down to about less than 20 nm.

In some embodiments, the trimming process is performed by a suitable process such as, but not limited to, a dry etching process, a wet etching process, or a combination thereof. The wet etching solution may include a tetramethylammonium hydroxide (TMAH), an $HF/HNO_3/CH_3COOH$ solution, or other suitable solution. The dry etching process may include a biased plasma etching using a chlorine-based chemistry, and other dry etchant gases include $CF_4$, $NF_3$, $SF_6$, and He. The dry etching may be performed anisotropically, such as with DRIE (deep reactive-ion etching) techniques. The respective etch process may be tuned with various etching parameters, such as etchant used, etching temperature, etching solution concentration, etching pressure, source power, RF bias voltage, RF bias power, etchant flow rate, and/or other suitable parameters.

In some embodiments, the spacing 320 forms ring-shaped patterns in the photoresist layer 300. The ring-shaped patterns may be circular rings, irregular rings, polygonal rings such as triangle rings, rectangle rings, hexagonal rings, or other types of rings.

Figure 4A:
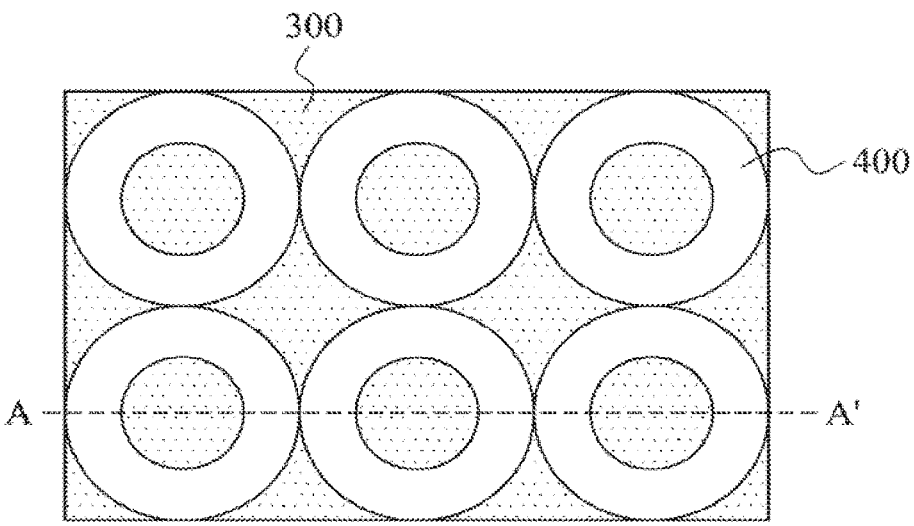
Figure 4B:
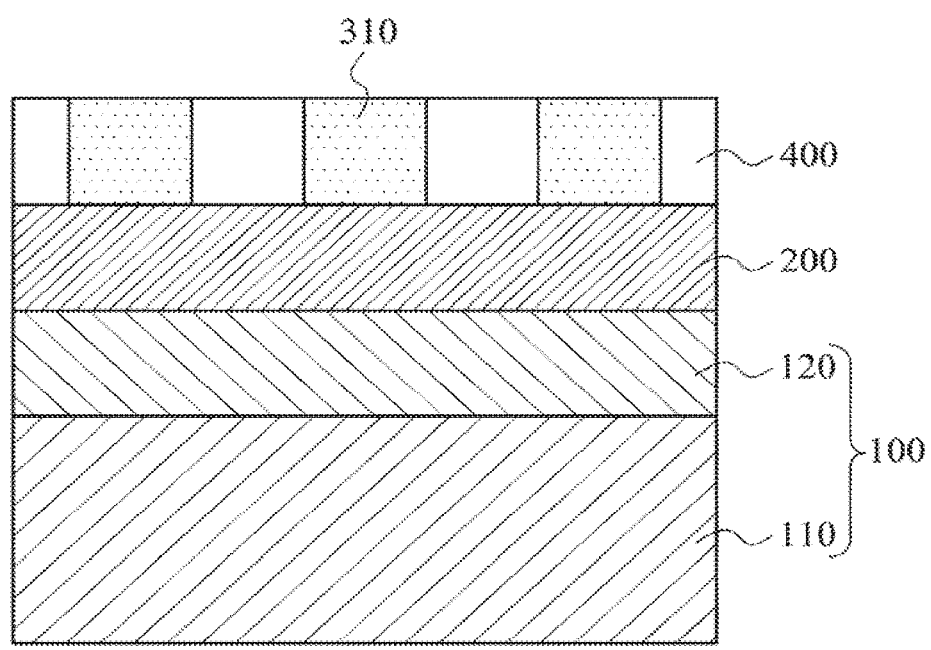

Subsequently, referring to FIGS. 4A and 4B, a second material layer 400 is formed to fill in the enlarged spacing 320 and surround the trimmed island portion 310. Forming the second material layer 400 to fill in the enlarged spacing 320 comprises depositing the material of the second material layer 400 covering the trimmed island portion 310 and filling the enlarged spacing 320, and then etching back the material of the second material layer 400 to expose the trimmed island portion 310 so as to form the second material layer 400.

In some embodiments, the second material layer 400 may form a plurality of circular rings, a plurality of irregular rings, a plurality of polygonal rings such as a plurality of triangle rings, a plurality of rectangle rings, a plurality of hexagonal rings, or any other ring forms. The second material layer 400 may also form a plurality of contact rings.

Figure 5A:
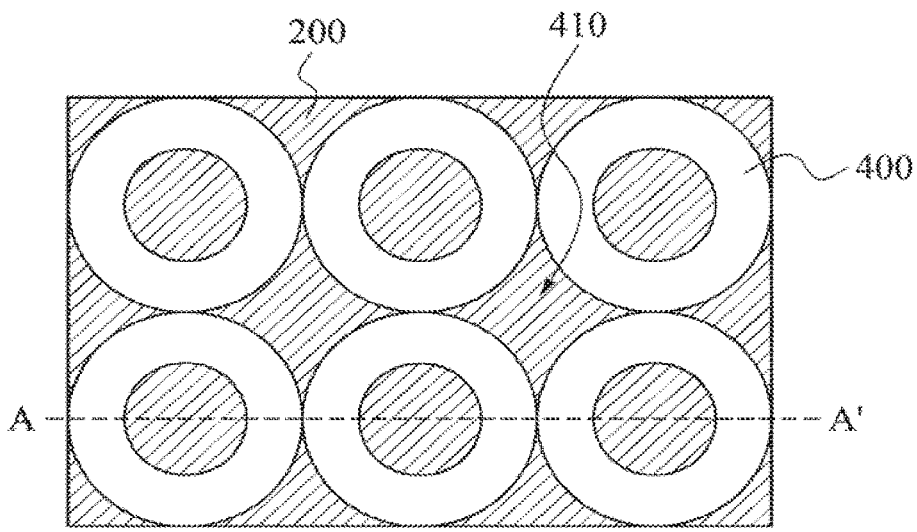
Figure 5B:
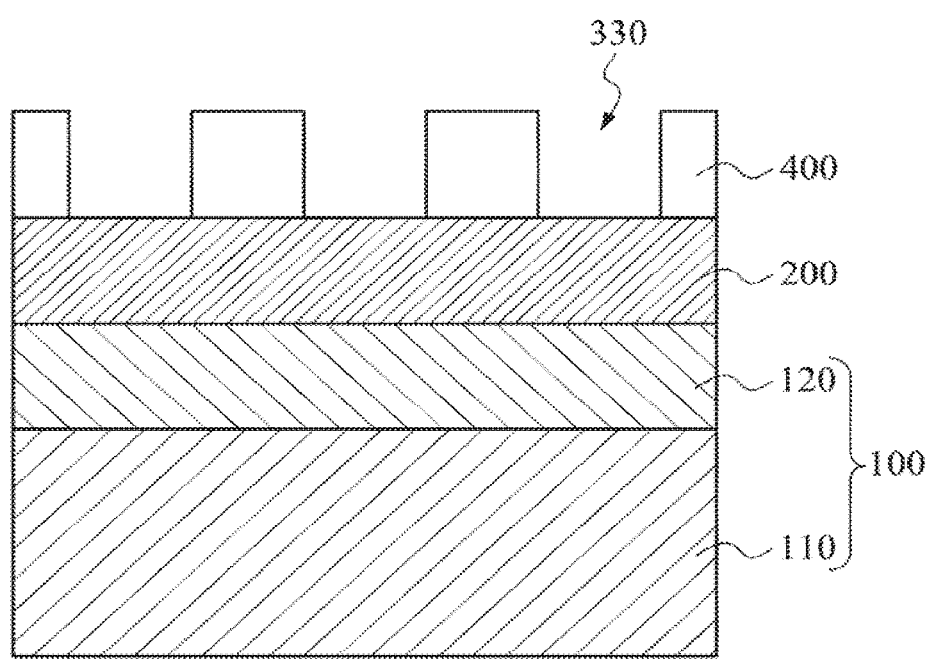

Referring to FIGS. 5A and 5B, the trimmed island portion 310 is removed, thus forming a plurality of first openings 330 in the second material layer 400. A portion of the first material layer 200 is then exposed through the first openings 330. The second material layer 400 substantially defines a contact hole pattern with circular holes and star-like holes 410.

It is noted that the second material layer 400 is herein used as a mask to transfer the contact holes pattern into the underlying first material layer 200. Therefore, only one single mask layer is needed for forming the contact holes pattern by using the filled-in second material layer 400 as another mask in order to avoid misalignment and printing defects caused by a double masking process.

Figure 6A:
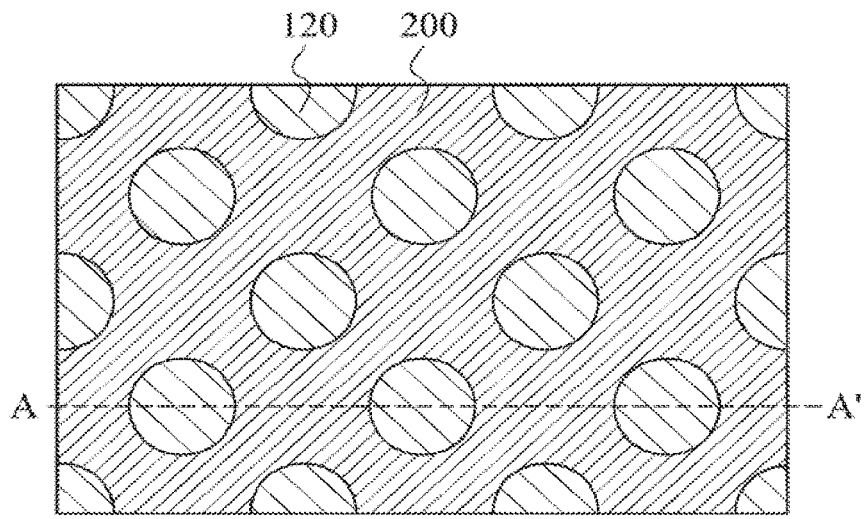
Figure 6B:
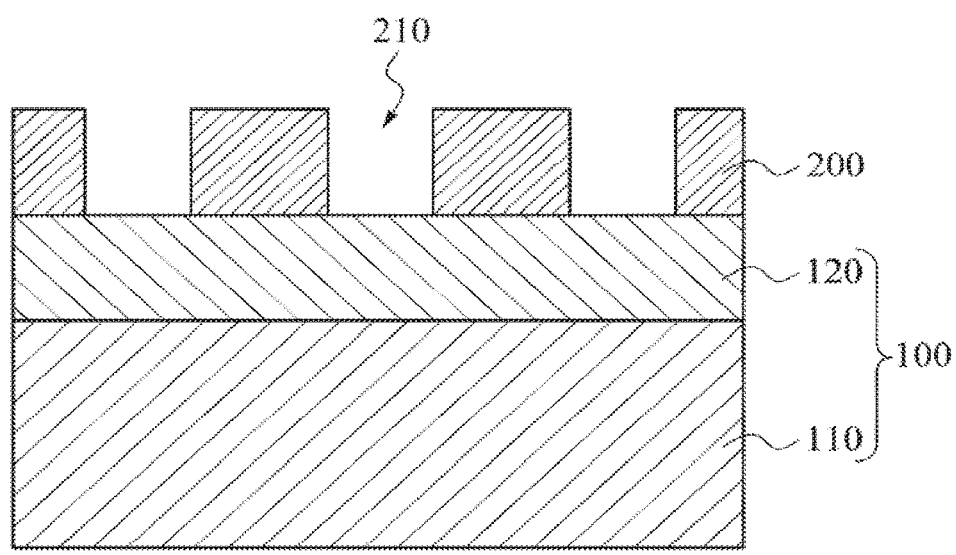

Referring to FIGS. 6A and 6B, the contact holes pattern is transferred into the underlying first material layer 200 through the removal of the second material layer 400 and the exposed portion of the first material layer 200. The exposed portion of the first material layer 200 is removed through the first openings 330 and then forms a plurality of second openings 210 in the first material layer 200.

After the first material layer 200 is patterned, a portion of the target layer 120 is exposed through the second openings 210. The contact holes pattern of the first material layer 200 is defined by the plurality of the second openings 210. The half pitch of the contact holes may be more than 20 nm or even down to about less than 20 nm.

In some embodiments, the removal of the second material layer 400 and the exposed portion of the first material layer 200 is performed by a suitable process such as, but not limited to, a dry etching process, a wet etching process, or a combination thereof. The wet etching solution may include a tetramethylammonium hydroxide (TMAH), an $HF/HNO_3/CH_3COOH$ solution, or other suitable solution. The dry etching process may include a biased plasma etching using a chlorine-based chemistry, and other dry etchant gases include $CF_4$, $NF_3$, $SF_6$, and He. The dry etching may also be performed anisotropically using such as DRIE (deep reactive-ion etching) techniques. The respective etch process may be tuned with various etching parameters, such as etchant used, etching temperature, etching solution concentration, etching pressure, source power, RF bias voltage, RF bias power, etchant flow rate, and/or other suitable parameters.

It is noted that while transferring the contact holes pattern of the second material layer 400 into the underlying first material layer 200 through etch process, the star-like holes 410 in FIG. 5A are rounded to form circular holes in FIG. 6A, therefore the transferred contact holes pattern of the first material layer 200 shows a contact holes pattern with only circular contact holes.

Figure 7A:
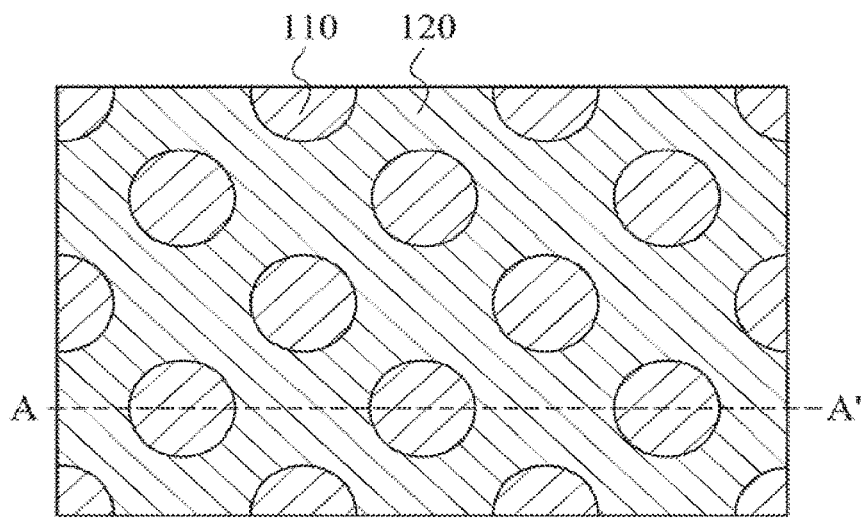
Figure 7B:
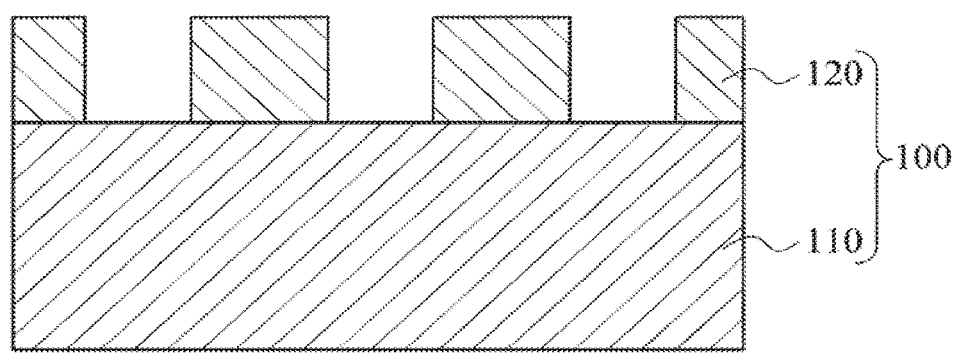

Referring to FIGS. 7A and 7B, the contact holes pattern of the first material layer 200 is subsequently transferred into the underlying first material layer 200 through the removal of the first material layer 200 and the exposed portion of the target layer 120. The exposed portion of the target layer 120 is removed through the second openings 210 of the first material layer 200. As a result, the contact holes pattern of the target layer 120 over the second substrate 110 is formed. The half pitch of the contact holes may be more than 20 nm or even down to about less than 20 nm.

In some embodiments, the removal of the first material layer 200 and the exposed portion of the target layer 120 is performed by a suitable process such as, but not limited to, a dry etching process, a wet etching process, or a combination thereof. The wet etching solution may include a tetramethylammonium hydroxide (TMAH), an $HF/HNO_3/CH_3COOH$ solution, or other suitable solution. The dry etching process may include a biased plasma etching using a chlorine-based chemistry, and other dry etchant gases include $CF_4$, $NF_3$, $SF_6$, and He. The dry etching may also be performed anisotropically using such as DRIE (deep reactive-ion etching) techniques. The respective etch process may be tuned with various etching parameters, such as etchant used, etching temperature, etching solution concentration, etching pressure, source power, RF bias voltage, RF bias power, etchant flow rate, and/or other suitable parameters.

It is noteworthy that above-described embodiments of the method for forming a pattern in a semiconductor device is merely an example and is not intended to be limiting, and various changes, substitutions, and alterations may be made without departing from the spirit and scope of the present disclosure.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the appended claims.

What is claimed is:

1. A method of fabricating a device, comprising:
   patterning a photoresist over a first material over a target material, the patterned photoresist comprising island portions and spaces laterally adjacent to the island portions;
   removing peripheral portions of the island portions to enlarge the spaces;
   forming a second material over the island portions and between the enlarged spaces;
   removing the second material from over the island portions without removing the second material from between the enlarged spaces and a top surface of the second material substantially coplanar with a top surface of the island portions;
   removing the island portions to form first openings in the second material;
   forming second openings in the first material exposed through the first openings; and
   removing the target material exposed through the second openings to form holes in the target material.

2. The method of claim 1, wherein removing peripheral portions of the island portions comprises decreasing a width of the island portions and increasing a width of the spaces to form enlarged spaces.

3. The method of claim 1, wherein removing the island portions to form first openings in the second material and forming second openings in the first material comprises forming the first openings and the second openings using a single mask.

4. The method of claim 1, wherein removing the target material exposed through the second openings to form holes in the target material comprises forming the holes at a width substantially the same as a width of the second openings in the first material.

5. The method of claim 1, wherein removing the target material exposed through the second openings to form holes in the target material comprises forming the holes in a semiconductor material.

6. The method of claim 1, wherein removing the target material exposed through the second openings to form holes comprises forming the holes comprising a lateral width substantially the same as a lateral width of the island portions.

7. A method of fabricating a device, comprising:
   patterning a photoresist adjacent a first material, the patterned photoresist comprising patterned photoresist portions and spaces laterally adjacent to the patterned photoresist portions and the first material adjacent a target material;
   removing peripheral portions of the patterned photoresist portions to increase a width of the spaces;

forming a second material in the spaces, the second material in contact with and extending between sidewalls of adjacent patterned photoresist portions and a top surface of the patterned photoresist portions exposed between adjacent second materials;

removing the patterned photoresist portions to form first openings in the second material;

forming second openings in the first material below the first openings; and removing the target material exposed through the second openings to form holes in the target material.

8. The method of claim 7, wherein patterning a photoresist adjacent a first material comprises forming the spaces at a first width and removing peripheral portions of the patterned photoresist portions to increase a width of the spaces comprises increasing the first width of the spaces to a second width.

9. The method of claim 8, further comprising transferring a pattern of the spaces comprising the second width to the first material.

10. The method of claim 7, wherein forming second openings in the first material below the first openings comprises transferring a pattern of the first openings to the first material.

11. The method of claim 7, wherein removing the target material exposed through the second openings to form holes in the target material comprises forming the holes in the target material at a half pitch of less than 20 nm.

12. The method of claim 7, wherein forming first openings and forming second openings comprises aligning the first openings in the second material and the second openings in the first material.

13. A method of fabricating a device, comprising:

patterning a photoresist adjacent a first material, the photoresist comprising ring-shaped portions spaced apart from one another and the first material adjacent a target material;

removing portions of the ring-shaped portions to enlarge spaces between the ring-shaped portions;

forming a second material between the ring-shaped portions, the second material extending between sidewalls of adjacent ring-shaped portions and a top surface of the second material substantially coplanar with a top surface of the island portions;

removing the ring-shaped portions to expose a portion of the first material;

removing the exposed portion of the first material to form openings in the first material; and removing a portion of the target material exposed through the openings in the first material to form holes in the target material.

14. The method of claim 13, wherein patterning a photoresist comprises forming the ring-shaped portions comprising circular rings, irregular-shaped rings, triangular rings, rectangular rings, or hexagonal rings.

15. The method of claim 13, wherein patterning a photoresist comprises forming the ring-shaped portions spaced apart from one another a first width.

16. The method of claim 15, wherein removing portions of the ring-shaped portions to enlarge spaces between the ring-shaped portions comprises forming the ring-shaped portions at a second width and the spaces at a third width.

17. The method of claim 13, wherein removing the exposed portion of the first material to form openings in the first material comprises forming the openings in the first material at a lateral width substantially the same as a lateral width of the holes in the target material.

18. The method of claim 13, wherein forming a second material between the ring-shaped portions comprises completely filling the spaces between the ring-shaped portions with the second material.

19. The method of claim 13, wherein removing a portion of the target material exposed through the openings in the first material to form holes in the target material comprises forming the holes in the target material at a pitch less than a pitch of the ring-shaped portions of the photoresist.

20. A method of fabricating a device, comprising:

patterning a photoresist over a first material over a target material, the patterned photoresist comprising island portions and spaces laterally adjacent to the island portions;

removing peripheral portions of the island portions to enlarge the spaces;

forming a second material between the enlarged spaces, the second material extending between sidewalls of adjacent island portions and a top surface of the second material substantially coplanar with a top surface of the island portions;

removing the island portions to form first openings in the second material;

forming second openings in the first material exposed through the first openings; and removing the target material exposed through the second openings to form holes in the target material.

* * * * *